(12) United States Patent
Fackenthal et al.

(10) Patent No.: US 7,577,024 B2
(45) Date of Patent: Aug. 18, 2009

(54) STREAMING MODE PROGRAMMING IN PHASE CHANGE MEMORIES

(75) Inventors: Richard E. Fackenthal, Carmichael, CA (US); Ferdinando Bedeschi, Biassono (IT); Ravi Annavajjhala, Folsom, CA (US); Giulio Casagrande, Vignate (IT)

(73) Assignee: Intel Corporation, Santa Clara, CA (US)

( * ) Notice: Subject to any disclaimer, the term of this patent is extended or adjusted under 35 U.S.C. 154(b) by 26 days.

(21) Appl. No.: 11/807,125

(22) Filed: May 25, 2007

(65) Prior Publication Data

US 2008/0291719 A1 Nov. 27, 2008

(51) Int. Cl.
*G11C 11/00* (2006.01)
(52) U.S. Cl. .................. 365/163; 365/148; 365/185.19; 365/185.18; 365/185.03; 257/2; 257/3; 257/4; 257/5
(58) Field of Classification Search .................. 365/163, 365/148, 185.19, 185.18, 185.03; 257/2–5
See application file for complete search history.

(56) References Cited

U.S. PATENT DOCUMENTS

| | | | |
|---|---|---|---|
| 5,912,839 A * | 6/1999 | Ovshinsky et al. ...... | 365/185.03 |
| 6,259,627 B1 * | 7/2001 | Wong ..................... | 365/185.21 |
| 6,922,359 B2 * | 7/2005 | Ooishi ................... | 365/185.16 |
| 6,937,511 B2 * | 8/2005 | Hsu et al. .............. | 365/185.03 |
| 7,002,832 B2 * | 2/2006 | Wuidart et al. ............. | 365/100 |
| 2004/0085806 A1 * | 5/2004 | Wuidart et al. ............. | 365/145 |
| 2004/0113135 A1 * | 6/2004 | Wicker ......................... | 257/2 |
| 2006/0002172 A1 * | 1/2006 | Venkataraman et al. ..... | 365/148 |
| 2006/0133157 A1 * | 6/2006 | Murin et al. ........... | 365/189.01 |
| 2006/0221678 A1 * | 10/2006 | Bedeschi et al. ............ | 365/163 |
| 2007/0247893 A1 * | 10/2007 | Bednorz et al. ............. | 365/148 |

* cited by examiner

*Primary Examiner*—Anh Phung
*Assistant Examiner*—Eric Wendler
(74) *Attorney, Agent, or Firm*—Trop, Pruner & Hu, P.C.

(57) ABSTRACT

A streaming programming mode may be implemented on user command in a phase change memory. In the streaming programming mode, accelerated programming may be achieved by ramping up to a voltage that it used for both reading and programming. Repeated programming operations may be streamed after one ramp up without ramping down the voltage on the memory cells between programming operations. This may save time. In addition, the memory may be read in between programming operations, again, without necessarily ramping down.

26 Claims, 3 Drawing Sheets

STREAMING MODE PROGRAMMING IN PHASE CHANGE MEMORIES

BACKGROUND

This invention relates generally to phase change memory devices.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

Figure 1:
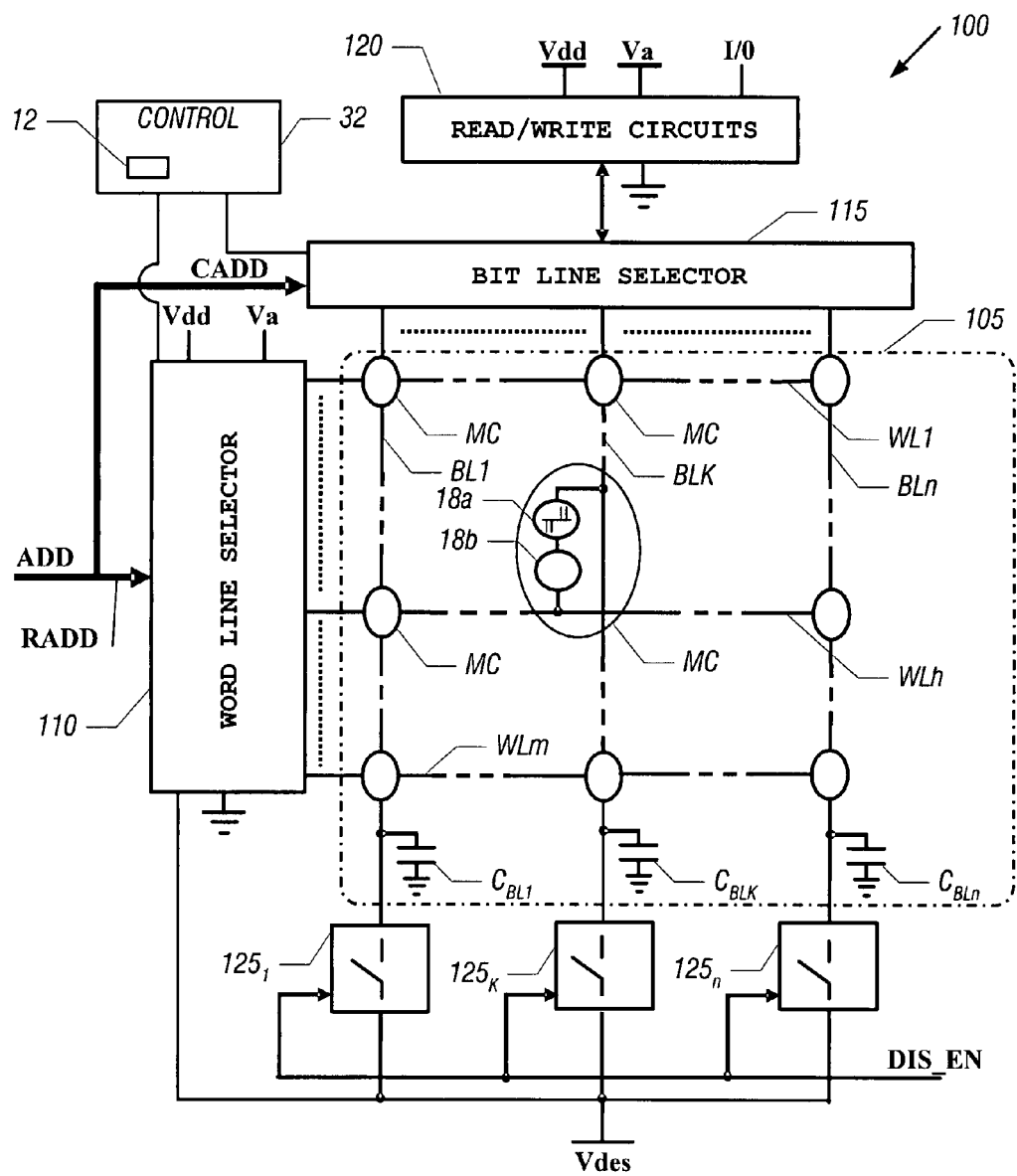
FIG. 1 is a schematic depiction of one embodiment of the present invention.

Referring to FIG. 1, in one embodiment, a memory 100 may include an array of memory cells MC arranged in rows WL and columns BL in accordance with one embodiment of the present invention. While a relatively small array is illustrated, the present invention is in no way limited to any particular size of an array. Also, the memory 100 may use single or multi-level memory cells MC. While the terms "rows," "word lines," "bit lines," and "columns" are used herein, they are merely meant to be illustrative and are not limiting with respect to the type and style of the sensed array.

The memory device 100 includes a plurality of memory cells MC typically arranged in a matrix 105. The memory cells MC in the matrix 105 may be arranged in m rows and n columns with a word line WL1-WLm associated with each matrix row, and a bit line BL1-BLn associated with each matrix column.

The memory device 100, in one embodiment, may also include a number of auxiliary lines including a supply voltage line Vdd, distributing a supply voltage Vdd through a chip including the memory device 100, that, depending on the specific memory device embodiment, may be, typically, from 1 to 3 V, for example 1.8 V, and a ground voltage line GND distributing a ground voltage. A high voltage supply line Va may provide a relatively high voltage, generated by devices (e.g. charge-pump voltage boosters not shown in the drawing) integrated on the same chip, or externally supplied to the memory device 100. For example, the high voltage Va may be 4.5-5 V in one embodiment.

The cell MC may be any memory cell including a phase change memory cell. Examples of phase change memory cells include those using chalcogenide memory element 18a and an access, select, or threshold device 18b coupled in series to the device 18a. The threshold device 18b may be an ovonic threshold switch that can be made of a chalcogenide alloy that does not exhibit an amorphous to crystalline phase change and which undergoes a rapid, electric field initiated change in electrical conductivity that persists only so long as a holding voltage is present.

A memory cell MC in the matrix 105 is connected to a respective one of the word lines WL1-WLm and a respective one of the bit lines BL1-BLn. In particular, the storage element 18a may have a first terminal connected to the respective bit line BL1-BLn and a second terminal connected to a first terminal of the associated device 18b. The device 18b may have a second terminal connected to a word line WL1-WLm. Alternatively, the storage element 18a may be connected to the respective word line WL1-WLm and the device 18b, associated with the storage element 18a, may be connected to the respective bit line BL1-BLn.

A memory cell MC within the matrix 105 is accessed by selecting the corresponding row and column pair, i.e. by selecting the corresponding word line and bit line pair. Word line selector circuits 110 and bit line selector circuits 115 may perform the selection of the word lines and of the bit lines on the basis of a row address binary code RADD and a column address binary code CADD, respectively, part of a memory address binary code ADD, for example received by the memory device 100 from a device external to the memory (e.g., a microprocessor). The word line selector circuits 110 may decode the row address code RADD and select a corresponding one of the word lines WL1-WLm, identified by the specific row address code RADD received. The bit line selector circuits 115 may decode the column address code CADD and select a corresponding bit line or, more generally, a corresponding bit line packet of the bit lines BL1-BLn. For example, the number of selected bit lines depending on the number of data words that can be read during a burst reading operation on the memory device 100. A bit line BL1-BLn may be identified by the received specific column address code CADD.

The bit line selector circuits 115 interface with read/write circuits 120. The read/write circuits 120 enable the writing of desired logic values into the selected memory cells MC, and reading of the logic values currently stored therein. For example, the read/write circuits 120 include sense amplifiers together with comparators, reference current/voltage generators, and current pulse generators for writing and reading the logic values stored in the memory cells MC.

In one embodiment, in a stand-by operating condition, as well as before any read or write access to the memory device 100, the word line selection circuits 110 may keep the word lines WL1-WLm at a relatively high de-selection voltage Vdes (e.g., a voltage roughly equal to half the high voltage Va (Va/2)). At the same time, the bit line selection circuits 115 may keep the bit lines BL1-BLn disconnected, and thus isolated, from the read/write circuits 120 or, alternatively, at the relatively low de-selection voltage Vdes. In this way, none of the memory cells MC is accessed, since the bit lines BL1-BLn are floating or a voltage approximately equal to zero is dropped across the access elements 18b, so the deselected row and column lines are at about the same voltage. Spare (redundant) rows and columns may be provided and used with a selection means to replace bad rows, bits, and columns by techniques familiar to those reasonably skilled in the art.

During a reading or a writing operation, the word line selection circuits 110 may lower (or raise if an MOS transistor select device is used) the voltage of a selected one of the word lines WL1-WLm to a word line selection voltage $V_{WL}$ (for example, having a value equal to 0V—the ground potential if a bipolar diode or a chalcogenide select device (such as an ovonic threshold switch) is used), while the remaining word lines may be kept at the word line de-selection voltage Vdes in one embodiment. Similarly, the bit line selection circuits 115 may couple a selected one of the bit lines BL1-BLn (more typically, a selected bit line packet) to the read/write circuits 120, while the remaining, non-selected bit lines may be left floating or held at the de-selection voltage, Vdes. Typically, when the memory device 100 is accessed, the read/write circuits 120 force a suitable current pulse into each selected bit line BL1-BLn. The pulse amplitude depends on the reading or writing operations to be performed.

In particular, during a reading operation a relatively low current pulse (compared to write current pulse magnitude) is applied to each selected bit line in one embodiment. The read current pulse may have a suitable amplitude and a suitable time duration. The read current causes the charging of stray capacitances $C_{BL1}$-$C_{BLn}$ (typically, of about 1 pF), intrinsically associated with the parasitic bit lines BL1-BLn and column drive circuitry, and, accordingly, a corresponding transient of a bit line voltage $V_{BL}$ at each selected bit line BL1-BLn. When the read current is forced into each selected bit line BL1-BLn, the respective bit line voltage raises towards a corresponding steady-state value, depending on the resistance of the storage element 18a, i.e., on the logic value stored in the selected memory cell MC. The duration of the transient depends on the state of the storage element 18a. If the storage element 18a is in the crystalline state and the threshold device 18b is switched on, a cell current flowing through the selected memory cell MC when the column is forced to a voltage has an amplitude lower than the amplitude in the case where the storage element 18a is in the higher resistivity or reset state, and the resulting voltage on the column line when a constant current is forced is lower for a set state relative to reset state.

The logic value stored in the memory cell MC may, in one embodiment, be evaluated by means of a comparison of the bit line voltage (or another voltage related to the bit line voltage) at, or close to, the steady state thereof with a suitable reference voltage, for example, obtained exploiting a service reference memory cell in an intermediate state or its equivalent. The reference voltage can, for example, be chosen to be an intermediate value between the bit line voltage when a logic value "0" is stored and the bit line voltage when a logic value "1" is stored.

In order to avoid spurious reading of the memory cells MC or to properly terminate the write cycle, the bit line stray capacitances $C_{BL1}$-$C_{BLn}$ may be discharged before performing a read operation. To this purpose, bit line discharge circuits $125_1$-$125_n$ are provided, associated with the bit lines BL1-BLn. The bit line discharge circuits $125_1$-$125_n$ may be enabled in a bit line discharge phase of the memory device operation, preceding and after any operation, for discharging the bit line stray capacitances $C_{BL1}$-$C_{BLn}$, in one embodiment.

The bit line discharge circuits $125_1$-$125_n$ may be implemented by means of transistors, particularly N-channel MOSFETs having a drain terminal connected to the corresponding bit line BL1-BLn, a source terminal connected to a de-selection voltage-supply line Vdes providing the de-selection voltage Vdes and a gate terminal controlled by a discharge enable signal DIS_EN in one embodiment. Before starting a writing or a reading operation, the discharge enable signal DIS_EN may be temporarily asserted to a sufficiently high positive voltage, so that all the discharge MOSFETs turn on and connect the bit lines BL1-BLn to the de-selection voltage supply line Vdes. The discharge currents that flow through the discharge transistors cause the discharge of the bit line stray capacitances $C_{BL1}$-$C_{BLn}$ for reaching the de-selection voltage Vdes. Then, before selecting the desired word line WL1-WLm, the discharge enable signal DIS_EN is de-asserted and the discharge MOSFETs turned off. Similarly, to minimize access delay, the selected row and column lines may be respectively pre-charged to an appropriate safe starting voltage for selection and read or write operation. For example, the row line may be precharged to zero volts while the column if forced to a voltage slightly less than minimum threshold voltage of the OTS.

The selection device 18b may be formed of a non-programmable chalcogenide material. While an embodiment is illustrated in which the selection device 18b is positioned over the phase change memory element 18a, the opposite orientation may be used as well.

Conversely, the phase change memory element 18a may be capable of assuming either a set or reset state, explained in more detail hereinafter. The phase change memory element 18a may include an insulator, a phase change memory material, a top electrode, and a barrier film, in one embodiment of the present invention. A lower electrode may be defined within the insulator in one embodiment of the present invention.

In one embodiment, the phase change material may be a phase change material suitable for non-volatile memory data storage. A phase change material may be a material having electrical properties (e.g., resistance) that may be changed through the application of energy such as, for example, heat, light, voltage potential, or electrical current.

Examples of phase change materials may include a chalcogenide material or an ovonic material. An ovonic material may be a material that undergoes electronic or structural changes and acts as a semiconductor once subjected to application of a voltage potential, electrical current, light, heat, etc. A chalcogenide material may be a material that includes at least one element from column VI of the periodic table or may be a material that includes one or more of the chalcogen elements, e.g., any of the elements of tellurium, sulfur, or selenium. Ovonic and chalcogenide materials may be non-volatile memory materials that may be used to store information.

In one embodiment, the memory material 64 may be chalcogenide element composition from the class of tellurium-germanium-antimony ($Te_xGe_ySb_z$) material or a GeSbTe alloy (such as x=2, y=2, z=5), although the scope of the present invention is not limited to just these materials.

In one embodiment, if the memory material is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the memory material in the substantially amorphous state is greater than the resistance of the memory material in the substantially crystalline state. Accordingly, in this embodiment, the memory material may be adapted to be altered to a particular one of a number of resistance values within a range of resistance values to provide digital or analog storage of information.

Programming of the memory material to alter the state or phase of the material may be accomplished by applying voltage potentials to the word lines and bitlines or forcing a current of adequate amplitude to melt the material, thereby generating a voltage potential across the memory material. An electrical current may flow through a portion of the memory material in response to the applied voltage potentials or current forced, and may result in heating of the memory material.

This heating and subsequent cooling may alter the memory state or phase of the memory material. Altering the phase or state of the memory material may alter an electrical characteristic of the memory material. For example, resistance of the material may be altered by altering the phase of the memory material. The memory material may also be referred to as a programmable resistive material or simply a programmable resistance material.

In one embodiment, a voltage potential difference of about 0.5 to 1.5 volts may be applied across a portion of the memory material by applying about 0 volts to a word line WL and about 0.5 to 1.5 volts to a bitline. A current flowing through the memory material in response to the applied voltage potentials may result in heating of the memory material. This heating and subsequent cooling may alter the memory state or phase of the material.

In a "reset" state, the memory material may be in an amorphous or semi-amorphous state and in a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted.

Due to electrical current, the memory material 64 may be heated to a relatively higher temperature to amorphisize memory material and "reset" memory material. Heating the volume or memory material to a relatively lower crystallization temperature may crystallize memory material and "set" memory material. Various resistances of memory material may be achieved to store more than one logical bit in one physical bit by varying the amount of current flow and duration through the volume of memory material. Alternatively, the bit may be written by tailoring the edge rate of the trailing edge of the programming current or voltage pulse, such as by using a trailing edge rate of less than 100 nsec to reset the bit or a trailing edge greater than 500 nsec to set the bit.

The information stored in memory material 64 may be read by measuring the resistance of the memory material. As an example, a read current may be provided to the memory material using opposed lines and a resulting read voltage across the memory material may be compared against a reference voltage using, for example, a sense amplifier. The read voltage above the selection device (such as an ovonic threshold switch, diode, or MOS transistor) may be proportional to the resistance exhibited by the memory storage element.

In order to select a cell MC on a column and row, the selection device 18b for the selected cell MC at that location may be operated. The selection device 18b activation allows current to flow through the memory element 18a in one embodiment of the present invention.

In a low voltage or low field regime A, the device 18b is off and may exhibit very high resistance in some embodiments. The off resistance can, for example, range from 100,000 ohms to greater than 10 gigaohms at a bias of half the threshold voltage, such as about 0.4V. The device 18b may remain in its off state until a threshold voltage VT or threshold current IT switches the device 18b to a highly conductive, low resistance selected on state. The voltage across the device 18b after turn on drops to a slightly lower voltage relative to V threshold, called the holding voltage $V_H$ plus the current forced times the dynamic resistance of the "on" selection device. In one embodiment of the present invention, as an example, the threshold voltage may be on the order of 1.1 volts and the holding voltage may be on the order of 0.9 volts, and the dynamic resistance may be 500 ohms.

After passing through the snapback region, in the on state, the device 18b voltage drop remains close to the holding voltage as the current passing through the device is increased up to a certain, relatively high, current level for writing or relatively low current for reading. Above that current level the device remains on but displays a finite differential resistance with the voltage drop increasing with increasing current. The device 18b may remain on until the current through the device 18b is dropped below a characteristic holding current value that is dependent on the size and the material utilized to form the device 18b.

In some embodiments of the present invention, the selection device 18b does not change phase. It remains permanently amorphous and its current-voltage characteristics may remain the same throughout its operating life.

As an example, for a 0.5 micrometer diameter device 18b formed of TeAsGeSSe having respective atomic percents of 16/13/15/1/55, the holding current may be on the order of 0.1 to 100 micro-amps in one embodiment. Below this holding current, the device 18b turns off and returns to the high resistance regime at low voltage, low field. The threshold current for the device 18b may generally be of the same order as the holding current and preferably greater than the holding current to avoid oscillations depending on read bias point. The holding current may be altered by changing process variables, such as the top and bottom electrode material and the chalcogenide material. The device 18b may allow a relatively high "on current" for a given area of device and voltage across it compared to conventional access devices such as metal oxide semiconductor field effect transistors or bipolar junction transistors or diodes.

In some embodiments, the higher current density of the device 18b in the on state allows for higher programming current available to the memory element 18a at reduced array voltages. Where the memory element 18a is a phase change memory, this enables the use of larger programming current phase change memory devices, reducing the need for sublithographic feature structures and the commensurate process complexity, cost, process variation, and device parameter variation.

One technique for addressing the array 105 uses a voltage V applied to the unselected column and rows, with zero voltage applied to the selected row. For the case where the device 100 is a phase change memory, the voltage V is chosen to be greater than or equal to the device 18b minimum threshold voltage, but less than two times the device 18b minimum threshold voltage. In other words, the maximum threshold voltage of the device 18b, and the maximum holding voltage of device 18b plus the maximum reset threshold voltage of the device 18a may be less than 2V. All of the unselected rows and columns may be biased at V/2.

With this approach, there is no bias voltage between the unselected rows and unselected columns. This reduces and minimizes background and standby leakage current.

After biasing the array in this manner, the memory elements 18a may be programmed and read by whatever means is needed for the particular memory technology involved, the dynamic resistances of the select device 18b and memory 18a are low enough so that the memory is above to be written in less than 2V volts. A memory element 18a that uses a phase change material may be programmed by forcing the current needed for memory element phase change or the memory array can be read by forcing a lower current to determine the device 18a resistance.

For the case of a phase change memory element 18a, programming a given selected bit in the array 105 can be as follows. Unselected rows and columns may be biased as described for addressing, such as at V. Zero volts is applied to the selected row. A current is forced on the selected column with a voltage compliance that is greater than the maximum threshold voltage of the device 18b, and equal to the maximum holding voltage plus the maximum threshold voltage of the device 18a plus margin to allow write. The current amplitude, duration, and pulse shape may be selected to place the memory element 18a in the desired phase and thus, the desired memory state. Preferably, the write pulse is terminated with a fast edge rate less than 10 nsec to write a reset bit and a slow edge rate greater than 200 nsec to write a set bit.

Reading a phase change memory element 18a can be performed as follows. Unselected rows and columns may be biased as described previously at V. Zero volts is applied to the selected row. A voltage is forced at a value greater than the maximum threshold voltage of the device 18b, but less than the minimum holding voltage of the device 18b plus the minimum threshold voltage of the element 18a on the selected column. The current compliance of this forced voltage is less than the current that could program or disturb the set phase of the memory element 18a. If the phase change memory element 18a is set, the access device 18b switches on and presents a low voltage, high current condition to a sense amplifier. If the device 18a is reset, a larger voltage, lower current condition may be presented to the sense amplifier. The sense amplifier can either compare the resulting column voltage to a reference voltage or compare the resulting column current to a reference current.

The above-described reading and programming protocols are merely examples of techniques that may be utilized. Other techniques may be utilized by those skilled in the art.

To avoid disturbing a set bit of memory element 18a that is a phase change memory, the peak current may equal the threshold voltage of the device 18b minus the holding voltage of the device 18b, that quantity divided by the total series resistance including the resistance of the device 18b, external resistance of device 18a, plus the set resistance of device 18a. This value may be less than the maximum programming current that will begin to reset a set bit for a short duration pulse.

Figure 2:
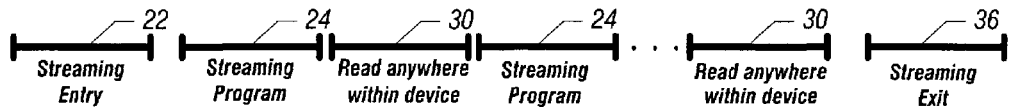
FIG. 2 is a depiction of the operation of one embodiment of the present invention.

Referring to FIG. 2, in accordance with one embodiment of the present invention, a streaming mode may be implemented. This is a mode in which a customer may initiate and complete a high voltage sequence to program a limited region of the device at a faster than normal rate, and, as necessary, read in the course of the streaming mode. The reads may be to anywhere in the memory.

Initially, there is a streaming entry mode 22 which is a high voltage power up. A voltage ramps up from zero to a voltage suitable for reading and programming. In some embodiments, this voltage may be about four volts. As an example, it may take about ten microseconds for this ramp up to complete. Thereafter, a streaming program algorithm 29 may be implemented to initiate programming. The programming may involve a series of programming pulses. These pulses may be followed by a program verify where the programming is verified by reading back and checking the programmed bits. As an example, the total time may be about 64 microseconds, in one illustrative example. Thereafter, a read command 30 may be received from the customer and the read may be done from anywhere within the memory.

This may be followed by any number of streaming programs 24 and read operations 30. Eventually, once the reading and streaming is done and the customer wants to exit the streaming mode, a streaming exit 36 is undertaken. This is a high voltage power down which ramps down from the read and programming voltage such as four volts down to zero, as one example. This may take about ten microseconds, as one example.

In some embodiments, it is not necessary to ramp down after each streaming program 24. This saves time since the ramp down may take a considerable amount of time. Thus, a series of streaming programs may be implemented, one after another, until such time as a customer desires to leave the programming mode. In addition, reads may be done in the course of such programming. Because of the manner of operation of flash memories, such an operation would not be feasible.

The programming may be done using only the program pulses and verify portions of an algorithm. The algorithm may be broken down into individual pieces that are invoked with separate commands. Thus, the streaming entry 22, the streaming program 24, and the read 30, as well as the streaming exit, may be invoked separately.

The streaming mode may allow faster bulk program operations by removing the high voltage ramp times from each program operation. It also allows any arbitrary mixture of program operations and read operations to occur while the high voltages are in their program-read states, between streaming entry and streaming exit calls.

Figure 3:
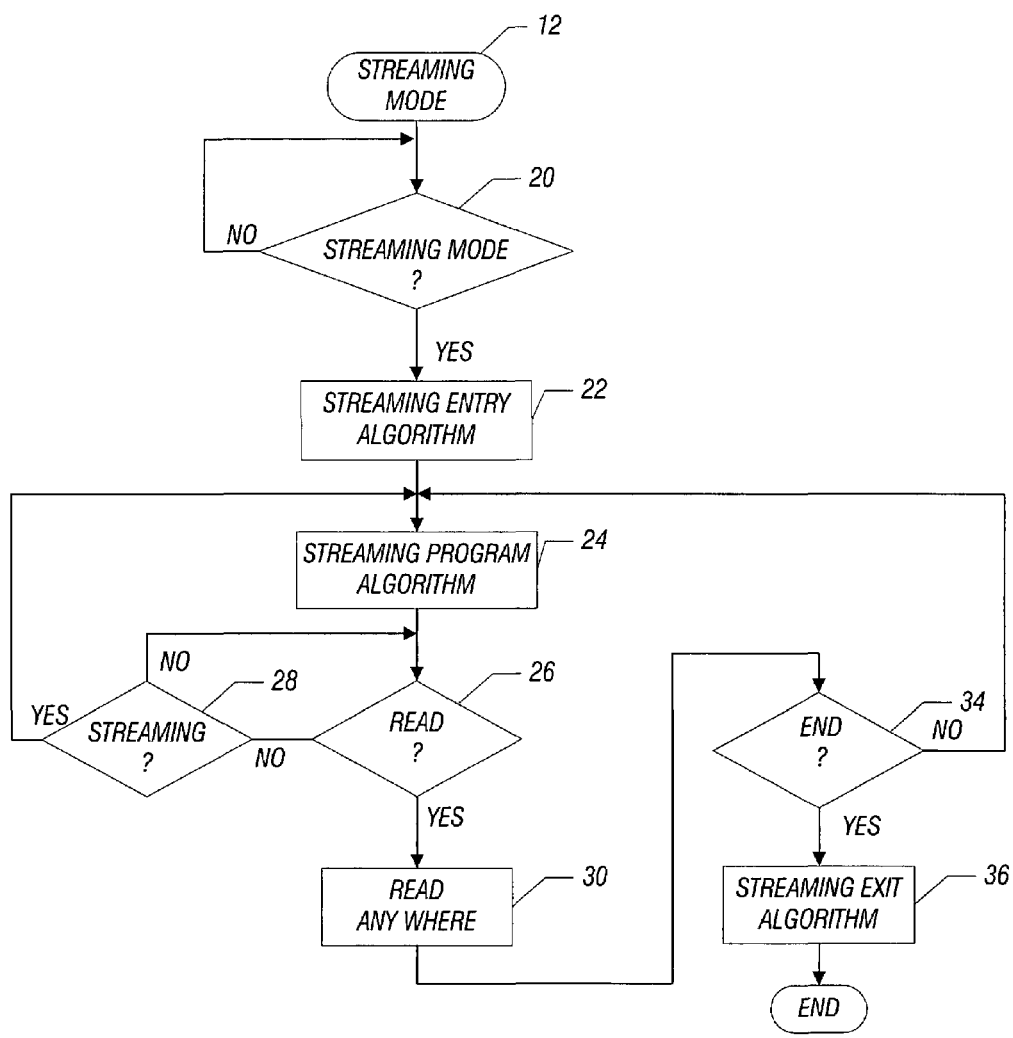
FIG. 3 is a flow chart for one embodiment of the present invention.

Thus, referring to FIG. 3, the streaming mode method 12 may be implemented in software, hardware, or firmware. In one embodiment, it may be stored on the control 32, as indicated in FIG. 1, and may be implemented by computer readable instructions that are stored in a tangible medium, such as hardware, a semiconductor memory, or a magnetic memory. The instructions may be executed by the control 32, in one embodiment, and the instructions may be stored internally or externally of the control 32.

The sequence begins by determining that the streaming mode has been called by the customer, as determined at diamond 20. If so, the streaming entry algorithm 22 is automatically implemented. This involves ramping up to the desired read and program voltage.

Thereafter, the streaming program algorithm 24 may be executed to program at a rapid pace. This may involve a series of program pulses, followed by a program verify. As indicated by block 24, the actual programming may be done as a discrete call and may be called repeatedly in the course of the streaming mode.

Next, a check at diamond 26 determines whether a read operation has been invoked. If so, the reading may be implemented from anywhere within the memory 100. If not, a check at diamond 28 determines whether another streaming call has been made. If so, the flow returns to the streaming program algorithm 24. Otherwise, the flow proceeds to wait for another read command.

Once the read command is completed, as indicated in block 30, a check at diamond 34 indicates whether the customer has indicated that the customer desires to end the streaming mode. If not, the flow iterates back to the streaming program algorithm 24. Otherwise, the exit streaming algorithm 36 is executed to ramp down from the high voltage level.

Figure 4:
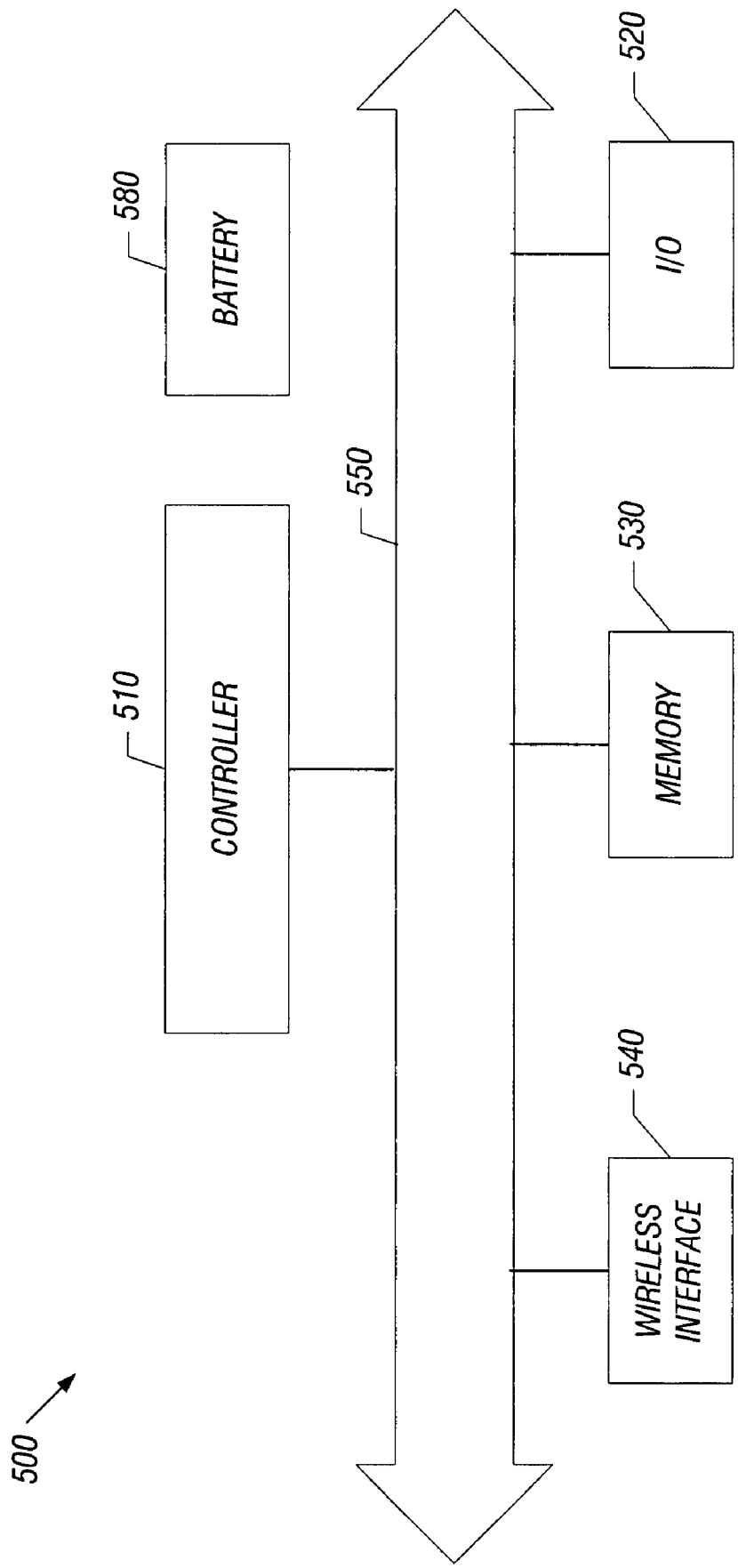
FIG. 4 is a system diagram for one embodiment of the present invention.

Turning to FIG. 4, a portion of a system 500 in accordance with an embodiment of the present invention is described. System 500 may be used in wireless devices such as, for example, a cellular telephone, personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, and a wireless interface 540, coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 530 may be provided by one or more different types of memory. For example, memory 530 may comprise a volatile memory (any type of random access memory), a non-volatile memory such as a flash memory, and/or phase change memory that includes a memory element 18a such as, for example, memory 100 illustrated in FIG. 1.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
providing selectable first and second reading modes;
programming and reading a group of phase change memory cells using a programming voltage for both reading and programming in said first mode; and
reading said group of cells in said second mode using a voltage lower than said programming voltage.

2. The method of claim 1 including implementing at least two separate streaming program mode programming operations without a voltage ramp down.

3. The method of claim 1 including providing a streaming entry mode to ramp up to a voltage for both programming and reading.

4. The method of claim 1 including programming a phase change memory cell including a chalcogenide containing memory element and an ovonic threshold switch in series.

5. The method of claim 1 wherein programming a phase change memory includes programming a phase change memory including a chalcogenide material.

6. The method of claim 2 including reading from the memory during said streaming program mode without a voltage ramp down from said programming voltage.

7. The method of claim 3 including repeatedly programming and reading without ramping down.

8. A computer readable medium storing computer executable instructions that, when executed, cause a processor-based system to program and read a group of phase change memory cells using a programming voltage.

9. The medium of claim 8 further storing instructions to implement at least two separate streaming program mode programming operations without a voltage ramp down.

10. The medium of claim 8 further storing instructions to provide a streaming entry mode to ramp up to a voltage for both programming and reading.

11. The medium of claim 8 further storing instructions to program a phase change memory cell including a chalcogenide containing memory element and an ovonic threshold switch in series.

12. The medium of claim 8 further storing instructions to program a phase change memory including programming a phase change memory including a chalcogenide material.

13. The medium of claim 9 further storing instructions to read from the memory during said streaming program mode without a voltage ramp down from said programming voltage.

14. The medium of claim 10 further storing instructions to repeatedly program and read without ramping down.

15. A phase change memory comprising:
providing selectable first and second reading modes;
a plurality of memory cells including a chalcogenide material;
a control to program and read a group of memory cells using a programming voltage for both reading and programming in said first mode; and
reading said group of cells in said second mode using a voltage lower than said programming voltage.

16. The memory of claim 15 wherein said memory cells include an ovonic threshold switch in series with a memory element.

17. The memory of claim 15, said control to implement at least two separate streaming program mode programming operations without a voltage ramp down.

18. The memory of claim 15, said control to provide a streaming entry mode to ramp up to a voltage for both programming and reading.

19. The memory of claim 17, said control to read from the memory during said streaming program mode without a voltage ramp down from said programming voltage.

20. The memory of claim 18, said control to repeatedly program and read without ramping down.

21. A system comprising:
   a processor;
   a phase change memory including a plurality of chalcogenide memory cells and a control to ramp up a voltage on said memory cells, program said memory cells in a streaming mode, and to ramp down said programming voltage, said control to program and read said cells using a program voltage level for both reading and programming in said first mode; and
   reading said group of cells in said second mode using a voltage lower than said program voltage level.

22. The system of claim 21 wherein said memory cells include an ovonic threshold switch in series with a memory element.

23. The system of claim 21, said control to implement at least two separate streaming program mode programming operations without a voltage ramp down.

24. The system of claim 21, said control to provide a streaming entry mode to ramp up to a voltage for both programming and reading.

25. The system of claim 23, said control to read from the memory during said streaming program mode without a voltage ramp down from said programming voltage.

26. The system of claim 24, said control to repeatedly program and read without ramping down.

* * * * *